(12) United States Patent
Zhao et al.

(10) Patent No.: US 10,962,765 B1
(45) Date of Patent: Mar. 30, 2021

(54) LARGE MOTION LATCHING MICROELECTROMECHANICAL DISPLACEMENT STRUCTURES

(71) Applicant: Agiltron, Inc., Woburn, MA (US)

(72) Inventors: Jing Zhao, Andover, MA (US); Xiangchen Che, Woburn, MA (US)

(73) Assignee: Agiltron, Inc., Woburn, MA (US)

( * ) Notice: Subject to any disclaimer, the term of this patent is extended or adjusted under 35 U.S.C. 154(b) by 266 days.

(21) Appl. No.: 16/367,031

(22) Filed: Mar. 27, 2019

(51) Int. Cl.
*G02B 26/08* (2006.01)
*B81B 7/00* (2006.01)
*B81B 7/02* (2006.01)

(52) U.S. Cl.
CPC .......... *G02B 26/0841* (2013.01); *B81B 7/008* (2013.01); *B81B 7/02* (2013.01); *B81B 2201/031* (2013.01); *B81B 2201/042* (2013.01); *B81B 2207/015* (2013.01); *B81B 2207/07* (2013.01)

(58) Field of Classification Search
CPC ....... G02B 26/0841; B81B 7/008; B81B 7/02; B81B 2201/031; B81B 2201/042; B81B 2207/07; B81B 2207/015

USPC .......................................................... 359/290
See application file for complete search history.

(56) References Cited

U.S. PATENT DOCUMENTS

| 6,262,512 B1 | 7/2001 | Mahadevan |
| 9,082,353 B2* | 7/2015 | Lewis ................... G09G 3/2003 |
| 2002/0125117 A1* | 9/2002 | Knieser ................ H02N 1/008 200/181 |
| 2003/0101721 A1 | 6/2003 | Janssen et al. |

\* cited by examiner

*Primary Examiner* — Mohammed A Hasan
(74) *Attorney, Agent, or Firm* — Shifrin Patent Law; Dan Shifrin

(57) ABSTRACT

A planer silicon-based displacement amplification structure and a method are provided for latching the displacement. The displacement amplification structure may include a first actuation beam and a second actuation beam coupled to the first beam with an angle, the ends of the first beam and the second beam coupled to fixture sites, and an end of the second beam coupled to a motion actuator; a motion shutter coupled to an opposing end of the first and second beams; and a latching thermoelectric displacement structure blocking the shutter return path and have faster response than the shutter structure.

15 Claims, 4 Drawing Sheets

LARGE MOTION LATCHING MICROELECTROMECHANICAL DISPLACEMENT STRUCTURES

TECHNICAL FIELD

The present disclosure relates to a microelectromechanical systems (MEMS) and, in particular, to a MEMS structure that can latch a large displacement after power is removed.

BACKGROUND

MEMS actuation technologies can be categorized into electrostatic, thermoelectric, and electromagnetic. Electrostatic technology is commonly used in MEMS structures and has the advantage of low power consumption and ease in achieving multiple directional motions. In additional to potential stiction issues due to their large surface area-to-volume ratio, electrostatic MEMS have a disadvantage in that they require hematic sealing to prevent moisture-induced high electrical field shorting, resulting in increased cost. Electromagnetic MEMS requires integration of coils or magnets, which is not compatible with conventional MEMS processes, leading to difficulties in production. Thermoelectric MEMS structures have a relatively simple device configuration that can be produced by a low cost semiconductor batch fabrication process with relaxed tolerance. However, conventional thermoelectric MEMS structures consume large amounts of energy, which limits their applications.

SUMMARY OF THE INVENTION

Embodiments of the present invention provide a thermoelectric MEMS structure that can generate a large displacement using a small amount of electrical energy and that latch to a position without the need to continuously supply electrical power. By applying an electrical reversal pulse, the MEMS structure will return to its original position. Such a binary latching MEMS structure has various applications, such as an optical shutter for a laser, as an optical switch, among others. This class of large motion and latching MEMS has cost and power consumption advantages over conventional MEMS.

BRIEF DESCRIPTION OF THE DRAWINGS

The present disclosure is to be read in conjunction with the accompanying drawings, in which.

DETAILED DESCRIPTION

The following detailed description is of the best currently contemplated modes of carrying out the present disclosure. The description is not to be taken in a limiting sense, but is made merely for the purpose of illustrating the general principles of the present disclosure, because the scope of the present disclosure is defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and the claims are to be understood as being modified in all instances by the term "about." Further, any quantity modified by the term "about" or the like should be understood as encompassing a range of ±10% of that quantity.

For the purposes of describing and defining the present disclosure, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

In accordance with embodiments of the present disclosure, the embodiments of thermoelectric MEMS configurations of the present invention generally include three components having different functions: a thermal expansion based thermoelectric actuator, a motion mechanical amplification structure, and a thermoelectric latching structure.

Figure 1:
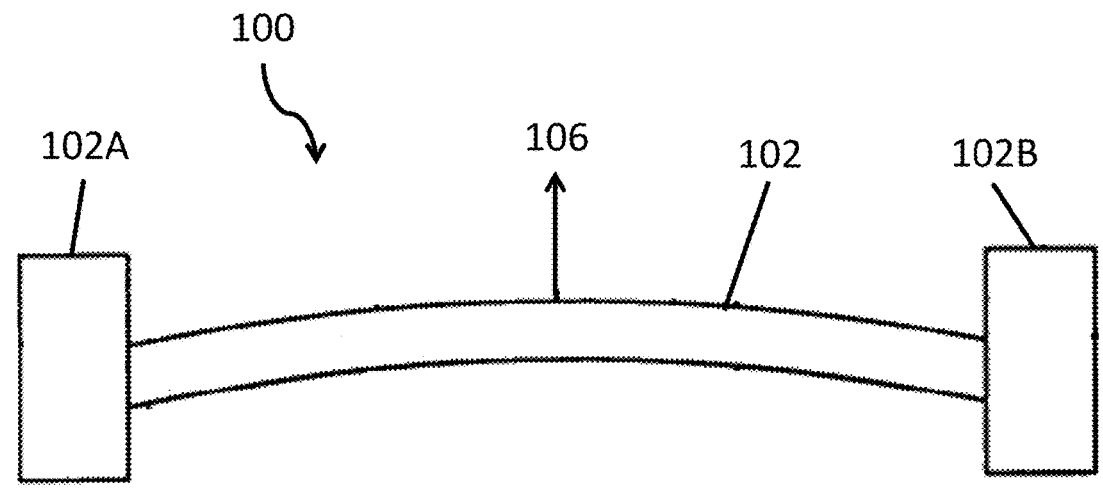
FIG. 1 illustrates a prior art thermoelectric MEMS actuator having a uniform beam design.

Several thermal MEMS actuation designs have been reported. The prior designs are all based on uniform beam structures, such as illustrated in FIG. 1. The MEMS 100 includes a conducting silicon actuation beam 102 fixed at two ends to two supports 102A, 102B. When current is applied to the beam 102 through the supports 104A, 104B, thermal expansion causes the beam 102 to be displaced in the direction indicated by the arrow 106. One disadvantage of the design is that thermoelectrically induced bending is affected by the load condition; thus the displacement of the beam 102 is less precise and repeatable than desired.

Figure 2:
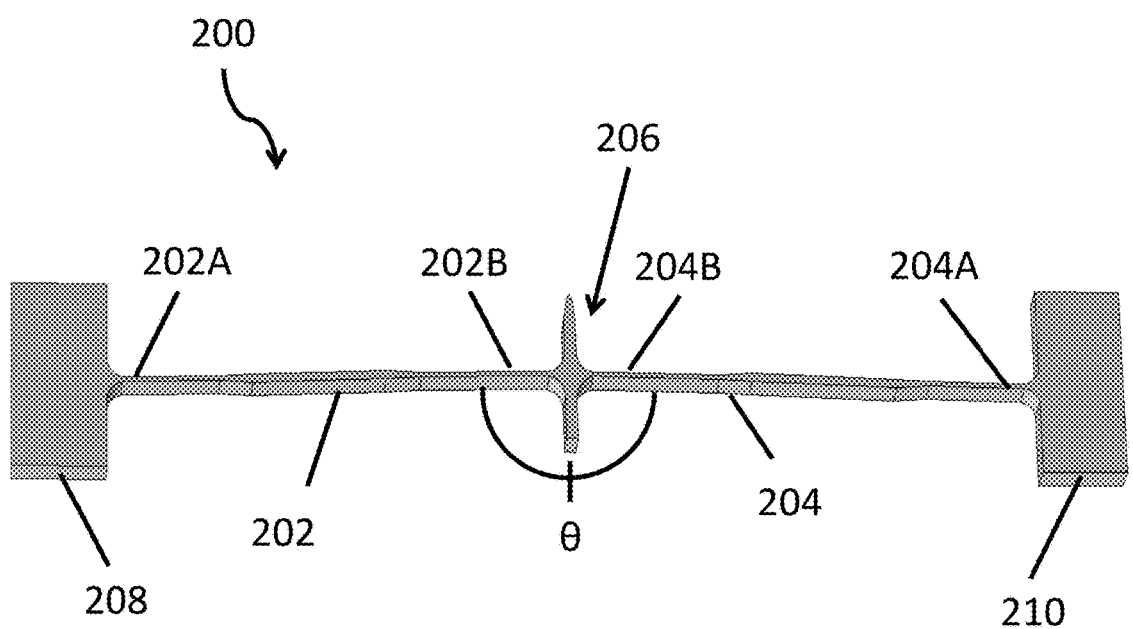
FIG. 2 illustrates an embodiment of a thermoelectric MEMS actuator of the present invention having a non-uniform beam.

FIG. 2 illustrates an embodiment of a thermoelectric MEMS actuator 200 of the present invention in which the beam structure is non-uniform. The MEMS 200 comprises two electrically-conductive beams 202 and 204 that are connected at the center 206 with an angle θ less than 180° (inverted V shape with the apex pointed upwards in the FIG.). As a result, thermal expansion induced beam motion in a direction substantially perpendicular to the beams 202 and 204 will be concentrated at the center point 206. Furthermore, the MEMS 200 has thinner sections at high stress points along the actuation beams 202 and 204. One set of thinner sections 202A and 204A is near the two outer end points where the beams 202 and 204 are secured to the bases 208 and 210. The other set is at the inner locations 202B and 204B where the beams 202 and 204 are secured to the center point 206. These thinner sections 202A, 204A and 202B, 204B of the beams 202, 204 cause the bending or displacement to occur primarily in the thinner sections 202A, 204A and 202B, 204B making the overall curvature shape of the beams 202, 204 less dependent on the load. The improved design of the present invention increases displacement control precision and displacement reproducibility. Precision and repeatable thermoelectric-induced displacements are required for many applications, such as optical variable attenuators and optical switches.

Figure 3:
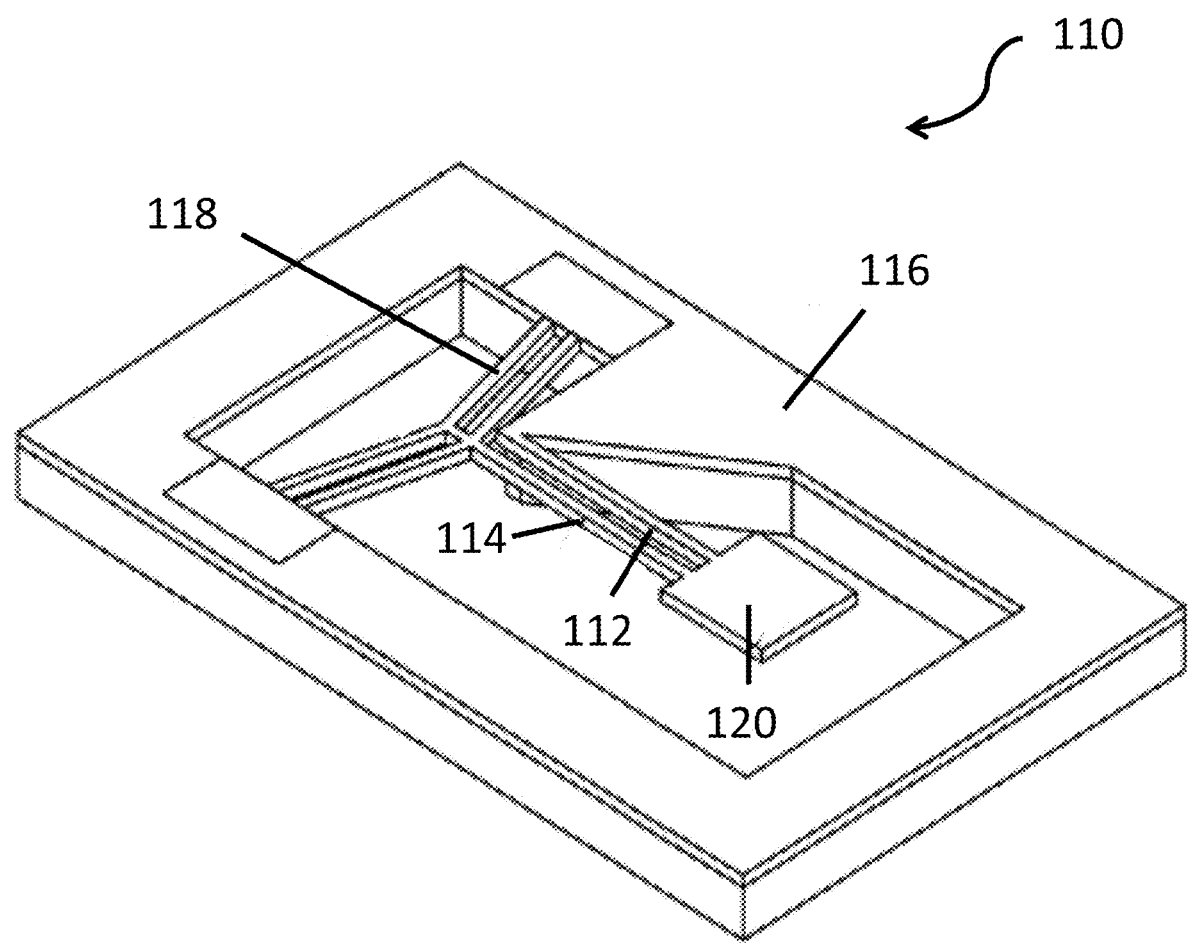
FIG. 3 illustrates a perspective view of a prior art MEMS displacement amplification structure.

The small displacement typically generated by thermal expansion of the beams is often insufficient for certain applications. It can be important to amplify the motion of the beams. There are several known MEMS displacement amplification structures. One such example is shown in FIG. 3. The displacement amplification structure 110 includes two beams 112 and 114 that are closely positioned and substantially parallel to each other. The two beams 112 and 114 have a ribbon shape and are made of flexible, single crystal silicon. As shown in FIG. 3, one end of the first beam 112 is fixed to an fixed base 116. A corresponding end of the second beam 114 is connected to a thermoelectric actuator 118 having a degree of freedom along its axis direction. The other ends of the beams 112 and 114 are connected to a movable member 120, such as a mirror. Although the description herein will refer to element 120 as a "mirror," such references are not intended to be exclusive and other movable elements may be incorporated into the system 200, 400 of the present invention. An electrical current induced displacement (e.g., about 25 to 50 microns) along the longitudinal axis of the second beam 114 at the end connected to the actuator 118 bends the first and second beams 112 and 114 and causes a differential axis motion between the first and second beams 112 and 114. The differential motion transfers into a larger displacement (e.g., about 500 to 1,000 microns) for the motion shutter 120 in a transversal direction substantially parallel to the beams 112, 114. Although this motion structure can achieve large displacement with a relatively small electrical power, the design illustrated in FIG. 3 requires the continuously application of current to maintain the displacement, consuming substantial overall power and generating substantial heat.

Figure 4:
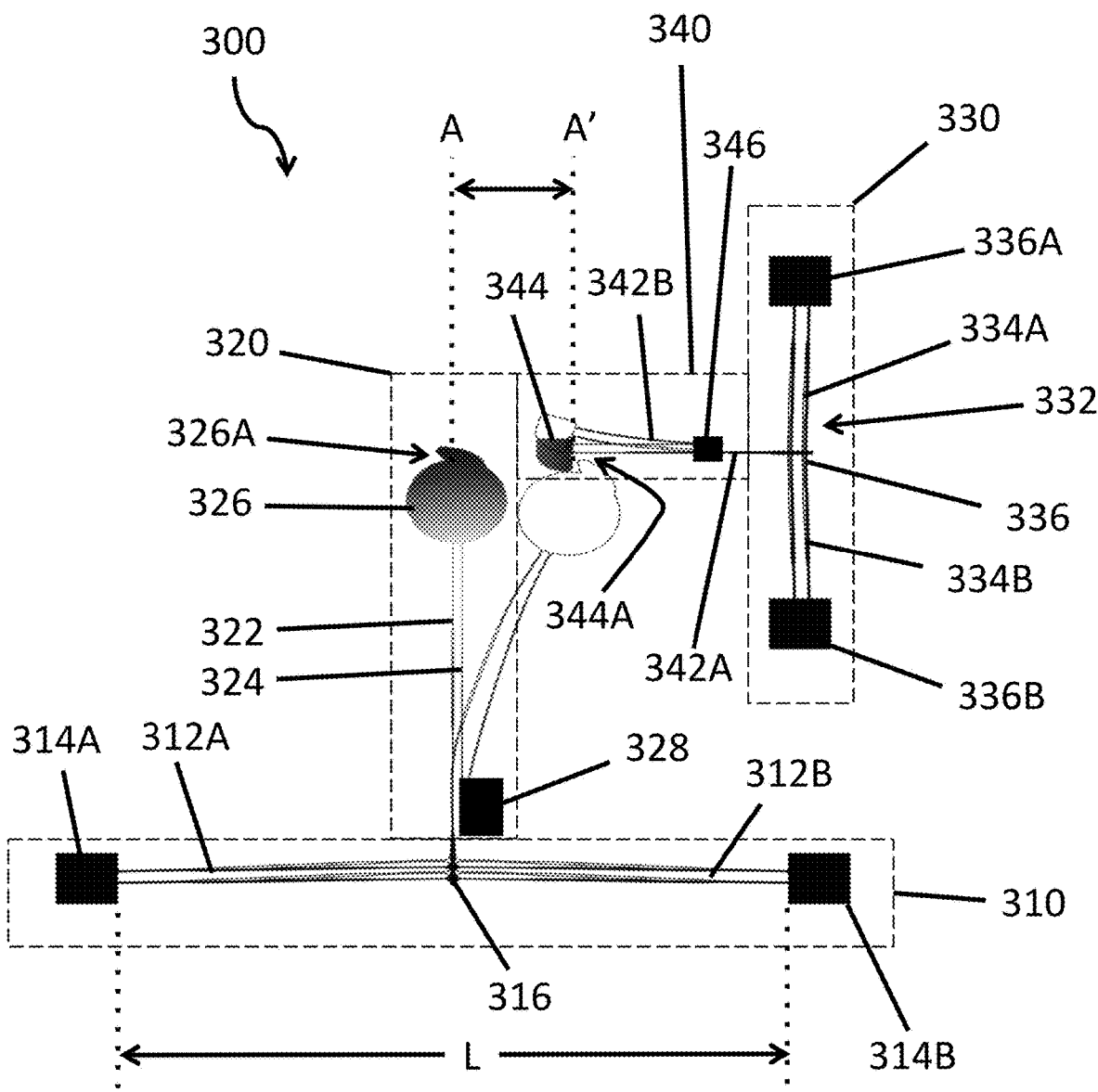
FIG. 4 illustrates an embodiment of a MEMS device of the present invention with a displacement amplification and latching structures.

FIG. 4 illustrates an embodiment of a MEMS device 300 of the present invention having large motion displacement and latching function structure. The device 300 is preferably a planer design formed of single crystal silicon, preferably using silicon on wafer (SOI) semiconductor fabrication process. The device 300 has a motion shutter/mirror 326 which is capable of switching between two positions A and A' and being latched in either position without the need to supply continuous electrical power.

The device 300 comprises three structures: a first thermoelectric actuator structure 310 (described above with respect to FIG. 2), a displacement amplification structure 320, and a latching actuator structure 330, 340. The first thermoelectric actuator 310 is preferably made of two electrically-conductive single-crystal silicon beams 312A and 312B each having one end fixed to the frame base at anchors 314A and 314B, which also serve as electrodes.

The center 316 of the first actuator structure 310 is connected to the displacement amplification structure 320, which includes a first beam 322 and a second beam 324 that are closely positioned, preferably closer than about 10 mm, and substantially parallel to each other and perpendicular to the beams 312A, 312B of the first actuator. One end of the first beam 322 is connected to the center 316 of the actuator 310 and the other end is connected to the mirror 326. One end of second beam 324 is fixed to a base at an anchor 328 and the other end is connected to the mirror 326. An electrical current passing through the electrodes 314A and 314B induces displacement of the beams 312A, 312B along an axis in the direction of the first beam 322 of the displacement amplification structure 320; that is, in a direction substantially perpendicular to the beams 312A, 312B. The displacement of the beams 312A, 312B causes a large differential axis motion between the beams 322 and 324. The differential motion transfers into a large displacement to move the mirror 326 transversely from its default position A to a displaced position A' or beyond.

An embodiment of the latching function structure 330 according to the present invention is also illustrated in FIG. 4. The latching structure 330 comprises a second thermoelectric actuator 332 (as also described above with respect to FIG. 2) made of electrically-conductive single crystal silicon beams 334A and 334B having two ends fixed to a base at anchors 336A and 336B, which also serve as electrodes. The center of the actuator 332 is connected to a second displacement amplification structure 340, including a first beam 342A and a second beam 342B that are closely positioned and substantially parallel to each other. One end of the beam 342A is connected to the actuator center 338 and the other end is connected to a blocking element ("blocker") 344. One end of second beam 342B is connected to the blocker 344 and the other end is fixed to a base 346.

In operation, an electrical current passes through the electrodes 336A and 336B of the latching structure 330 and at the same time through the electrodes 314A and 314B. Both the mirror 326 and the blocker 344 begin moving slightly over from their default or resting positions: the blocker 344 moves upward and the mirror 326 moves to or past position A'. When the electrical signals are removed from both actuators 310 and 330 at the same time, spring action of the beams 334A, 334B cause the blocker 344 to move back to its resting position, blocking movement of the mirror 326, resulting in latching the mirror 326 at position A'. In the embodiment illustrated, the mirror 326 includes a hooked portion 326A, such as a tab or notch, and the blocker 344 includes a corresponding tab 344A that engages the hooked portion 326A to prevent the mirror 326 from moving until the blocker 344 is raised again. It will be appreciated that other methods may be used for the blocker 344 to prevent the mirror 326 from returning to its resting position A.

The latching function is achieved because the latching structure 330, 340 is substantially faster than the mirror motion structures 310, 320. This enables the blocker 344 to first move out of the way of the mirror 326, allowing the mirror 326 to pass from position A to or past position A'. As the electrical signals are removed from both actuators 310, 330 at the same time, the blocker 344 again moves faster than the mirror 326 so that the return path of the mirror 326 to its resting position A is blocked. When an electrical signal is applied only to the latching actuator 330, the blocker 344 is raised and the mirror 326 at position A' is released to return to position A due to the spring effect of the beams 322 and 324, after which current is removed from the latching actuator 330. In other embodiments, the response speed may also be achieved electronically: current may be removed from the latching actuator 330 before it is removed from the first actuator 310, achieving the same result. In other embodiments, because the required displacement for the latching structure 330 is relatively small, the latching structure 330 may use other actuation designs with an amplification structure 340. Numerous thermoelectric actuator designs may be used as a latching function structure 330, 340 by blocking the return path of the mirror 326 at a faster response speed. And, although the thermoelectric actuators 310, 330 are both illustrated and described as including a pair of parallel beams, either or both of the actuators 310, 330 may instead be designed with just a single beam connected between the respective electrodes.

Simulation and fabrication experience indicate that the condition to achieve this latching function is that the difference between the total length of the two actuator beams plus the amplification beams should be larger than 10%. Thus, the total length of the beams 312A, 312B of the actuator structure 310 plus the beams 322 and 324 of the first amplification structure 320 is preferably more than 10% greater than the total length of the beams 334A, 334B of the latching actuator 330 plus the beam 342A and 342B of the second amplification structure 340. In FIG. 4, the arrow represents an example of beam length, in this case the length of the beams 312A, 312B in the actuator 310. The longer total length of the first mechanical structure is slower than the shorter length of the second mechanical structure. The total length is defined as the length of the actuator silicon beams that electrical current passes through plus amplification beam length from the fixed end to the actuation connecting point. For the embodiment shown in FIG. 4, the total length of the moving mirror structure is the combined length of the beams 312A and 312B plus the combined lengths of the beams 322 and 324. While the total length of the latching structure 330 is the combined lengths of the beams 334A and 334B plus the combined lengths of the beams 342A and 342B, the total length of the moving mirror structure 320 may be approximately 10% longer than the total length of the latching structure 330, 340 for the latching function to work.

Figure 5:
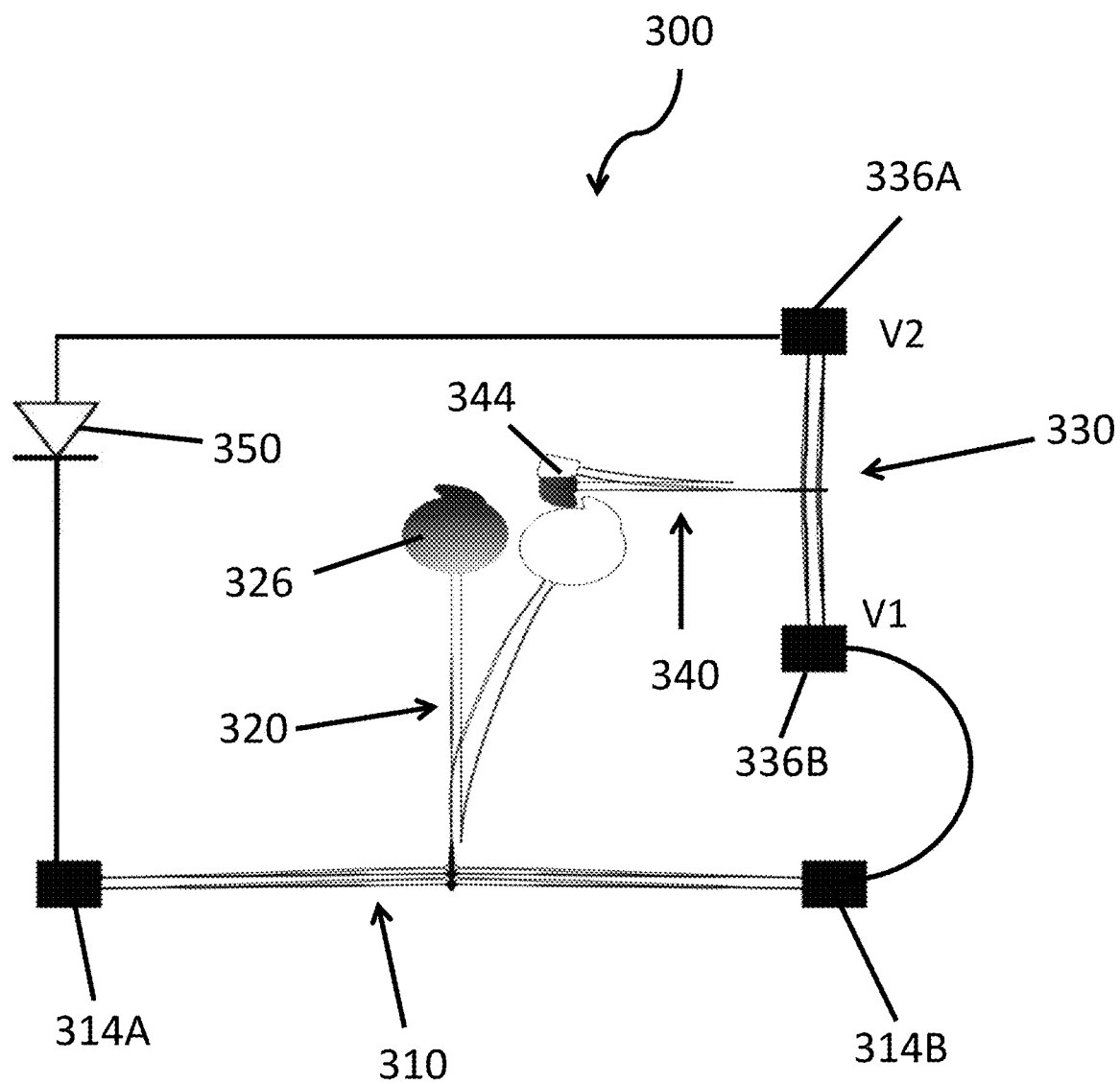
FIG. 5 illustrates an embodiment of a pulse driving circuit for the latching shutter structure of FIG. 4.

For convenient application, the latching moving mirror structure 300 may be driven by two electrodes with only a positive and negative pulse. This can be achieved by a control circuit having a diode 350 connected in series with the actuator electrodes 314A and 314B of the first actuator 310 and combining electrode 314B of the first actuator 310 with electrode 336B of the second actuator 330, as shown in FIG. 5. In this way, the electrodes 336A and 336B of the latching actuator 330 can serve as the device electrodes for a reversible power source represented by V1 and V2. By applying one voltage pulse with one polarity to both actuators 310 and 330, the mirror 326 moves from A to A'. An applied reversed polarity voltage pulse will only pass to the latching actuator 330, releasing the mirror to return to A. The diode 350 may be mounted onto the MEMS chip so that the device only has two external leads for convenience in connection and control.

In summary, the microelectromechanical motion structure of the present disclosure generates a controlled transversal motion in response to a small deformation in an axis direction of a motion actuator comprising an electrothermal material. Axis motion of one beam causes a differential axis motion of two parallel neighboring beams. Those two beams are connected at one end to a motion shutter. The other end of one beam is connected to a V-beam thermal actuator, while the other end of the other beam is fixed to the substrate. Furthermore, a microelectromechanical latching structure of the present disclosure generates a controlled transversal motion that is faster than the mirror motion so that the return path of the mirror can be blocked. Blocking is achieved by making the total length of the latching structure beam shorter than the total length of the of the moving mirror structure.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A latching microelectromechanical system, comprising:
a first thermoelectric actuator, comprising:
a first pair of spaced apart electrical terminals;
an electrically conductive first beam connected between the first pair of electrical terminals;
wherein, an electrical current applied to the first pair of electrical terminals induces thermal displacement of the first beam in a first direction substantially perpendicular to the first beam;
a movable element;
a first displacement amplification structure, comprising:
a second beam extending in the first direction, the second beam having a first end connected to a center of the first beam and a second end connected to the movable element; and
a third beam extending parallel to and closely spaced from the second beam, the third beam having a first end connected to a first fixed anchor and a second end connected to the movable element;
wherein:
displacement of the first beam induces a differential displacement of the second and third beams in a second direction substantially parallel to the first beam; and
displacement of the second and third beams induces displacement of the movable element in the second direction from a first resting position to a first displaced position; and
a latching actuator, comprising:
a second thermoelectric actuator, comprising:
a second pair of spaced apart electrical terminals;
an electrically conductive fourth beam connected between the second pair of electrical terminals; and
a blocker connected to a center of the fourth beam;
wherein:
an electrical current applied to the second pair of electrical terminals induces thermal displacement of the fourth beam in the second direction; and
displacement of the fourth beam induces displacement of the blocker in the first direction from a second resting position to a second displaced position;
wherein:
when the movable element and the blocker are in the first and second resting positions, respectively, a first electrical current applied to the first and second pair of electrical terminals induces displacement of the mirror from the first resting position to the first displaced position and induces displacement of the blocker from the second resting position to the second displaced position;
when the movable element and the blocker are in the first and second displaced positions, respectively, removal of the first electrical current from the first and second pair of electrical terminals returns the blocker to the second resting position before the movable element returns to the first resting position, thereby latching the movable element in the first displaced position; and
when the movable element and the blocker are in the first and second displaced positions, respectively, a second electrical current applied only to the second pair of electrical terminals induces displacement of the blocker from the second resting position to second displaced position, thereby releasing the movable element to return to the first resting position.

2. The system of claim 1, wherein the first beam comprises a pair of parallel beams.

3. The system of claim 1, wherein the fourth beam comprises a pair of parallel beams.

4. The system of claim 1, further comprising a second displacement amplification structure, comprising:
- a fifth beam extending in the second direction, the fifth beam having a first end connected to a center of the fourth beam and a second end connected to the blocker; and
- a sixth beam extending parallel to and closely spaced from the fifth beam, the sixth beam having a first end connected to a second fixed anchor and a second end connected to the blocker;

wherein:
- displacement of the fourth beam induces a differential displacement of the fifth and sixth beams in the first direction; and
- displacement of the fifth and sixth beams induces displacement of the blocker in the first direction from the second resting position to the second displaced position.

5. The system of claim 4, wherein movement of the movable element is slower than movement of the blocker.

6. The system of claim 5, wherein a combined length of the first beam, second, and third beams is approximately 10% larger than a combined length of the fourth, fifth, and sixth beams.

7. The system of claim 1, wherein the first beam comprises:
- a pair of first areas adjacent the first pair of terminals, the pair of first areas having a first thickness; and
- a second area extending between the pair of first areas, the second area having second thickness greater than the first thickness.

8. The system of claim 1, wherein the first beam comprises:
- first and second areas, each adjacent one of the first pair of terminals, the first and second areas having a first thickness;
- a third area adjacent the center of the first beam, the third area having the first thickness;
- fourth and fifth areas, extending between the first and third areas and between the second and third areas, respectfully, the fourth and fifth areas having a second thickness greater than the first thickness.

9. The system of claim 1, further comprising a control circuit configured to pass the first current of a first polarity through the first and second pairs of electrical terminals and to pass current of the second polarity, opposite the first polarity, only through the second pair of terminals.

10. The system of claim 9, wherein the control circuit comprises:
- an electrical connection between a first of the first pair of terminals and a first of the second pair of terminals;
- a diode electrically coupled between a second of the first pair of terminals and a second of the second pair of terminals;
- a reversible power source electrically coupled between the first and second of the second pair of terminals.

11. The system of claim 1, further comprising a control circuit configured to remove the first current from the second pair of electrical terminals before removing the first current from the first pair of terminals.

12. The system of claim 1, wherein the movable element comprises a mirror.

13. The system of claim 1, wherein:
- the movable element comprises a hooked portion; and
- the blocker comprises a tab configured to engage the hooked portion of the movable element when the first current is removed from the first and second pair of electrical terminals.

14. A method for operating a microelectromechanical system (MEMS), comprising:
- applying a first current of a first polarity through first and second pairs of electrodes, whereby:
  - thermoelectric displacement of a first actuator, coupled to the first pair of electrodes, in a first direction induces displacement in a first amplification structure coupled to the first actuator;
  - the displacement in the first amplification structure induces motion of a blocking element in a second direction from a first default position to a first displaced position, the second direction being substantially perpendicular to the first direction;
  - thermoelectric displacement of a second actuator, coupled to the second pair of electrodes, in the second direction induces displacement in a second amplification structure coupled to the second actuator; and
  - the displacement in the second amplification structure induces motion of a movable element in the first direction from a second default position to a second displaced position after motion of the blocking element;
- removing the first current from the first and second pairs of electrodes, whereby:
  - the blocking element returns to the first default position; and
  - the movable element is prevented by the blocking element from returning to the second default position; and
- applying a second current, having a second polarity opposite the first current, to the first pair of electrodes, whereby
  - displacement in the first amplification structure induces motion of the blocking element in the second direction from the first default position to the first displaced position; and
  - the movable element returns to the second default position.

15. The method of claim 14, wherein the movable element comprises a mirror.

* * * * *